(12) United States Patent
Kamata et al.

(10) Patent No.: US 12,283,465 B2
(45) Date of Patent: Apr. 22, 2025

(54) PLASMA PROCESSING APPARATUS AND PLASMA PROCESSING METHOD

(71) Applicant: TOKYO ELECTRON LIMITED, Tokyo (JP)

(72) Inventors: Eiki Kamata, Yamanashi (JP); Taro Ikeda, Yamanashi (JP); Satoru Kawakami, Yamanashi (JP); Takumi Kabe, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 167 days.

(21) Appl. No.: 18/008,008

(22) PCT Filed: Mar. 29, 2021

(86) PCT No.: PCT/JP2021/013262
§ 371 (c)(1),
(2) Date: Dec. 2, 2022

(87) PCT Pub. No.: WO2021/250981
PCT Pub. Date: Dec. 16, 2021

(65) Prior Publication Data
US 2023/0238219 A1 Jul. 27, 2023

(30) Foreign Application Priority Data
Jun. 11, 2020 (JP) ................................ 2020-101678

(51) Int. Cl.
*H01J 37/00* (2006.01)
*H01J 37/32* (2006.01)
*H01L 21/304* (2006.01)

(52) U.S. Cl.
CPC .... *H01J 37/3244* (2013.01); *H01J 37/32458* (2013.01); *H01J 37/32532* (2013.01); *H01J 2237/334* (2013.01); *H01L 21/304* (2013.01)

(58) Field of Classification Search
CPC ............. H01J 37/3244; H01J 37/32458; H01J 37/32532; H01J 2237/334; H01J 37/32715; H01L 21/304; H01L 21/3065
See application file for complete search history.

(56) References Cited

U.S. PATENT DOCUMENTS 8,414,790 B2 * 4/2013 Bailey, III ............... C23G 5/00
438/513
8,475,624 B2 * 7/2013 Sexton .............. H01L 21/02087
156/345.43

(Continued)

FOREIGN PATENT DOCUMENTS

| JP | 2009-253263 A | 10/2009 |
| JP | 2010-531538 A | 9/2010 |
| WO | WO 2008/109239 A1 | 9/2008 |

OTHER PUBLICATIONS

PCT International Search Report and Written Opinion, PCT Application No. PCT/JP2021/013262, Jun. 22, 2021, 9 pages (with English translation of PCT International Search Report).

*Primary Examiner* — Tuan T Lam
(74) *Attorney, Agent, or Firm* — Fenwick & West LLP

(57) ABSTRACT

This plasma processing apparatus for performing plasma processing on an end part of a substrate includes a processing container, a substrate supporting member configured to support a portion of the substrate and to which a high frequency power is applied, at least a side of the substrate supporting member being composed of a dielectric, an opposing dielectric member composed of a dielectric and disposed to oppose the substrate supporting member, and a gas supply configured to supply a processing gas for generating plasma on at least the end part of the substrate. The plasma processing apparatus further includes a side ground electrode provided at a side of the substrate so as to be close to the substrate to such an extent that an electrical coupling (Continued)

is formed between an end surface of the substrate and the side ground electrode, the side ground electrode having a ground potential.

8 Claims, 9 Drawing Sheets

(56) References Cited

U.S. PATENT DOCUMENTS

| | | | | |
|---|---|---|---|---|
| 8,562,750 | B2* | 10/2013 | Chen | C23C 16/04 427/284 |
| 8,580,078 | B2* | 11/2013 | Bailey, III | H01L 21/02087 156/345.43 |
| 9,184,043 | B2* | 11/2015 | Sexton | H01L 21/02057 |
| 2008/0277064 | A1* | 11/2008 | Kim | H01J 37/32091 156/345.38 |

* cited by examiner

PLASMA PROCESSING APPARATUS AND PLASMA PROCESSING METHOD

TECHNICAL FIELD

The present disclosure relates to a plasma processing apparatus and a plasma processing method.

BACKGROUND

Etching by-products such as polymers and the like are formed at an end part of a substrate such as a semiconductor wafer or the like, which causes particles in a subsequent process. Therefore, a technique for etching the end part of the substrate was proposed (see, e.g., Patent Document 1).

PRIOR ART DOCUMENTS

Patent Documents

Patent Document 1: Japanese Patent Publication No. 2010-531538

SUMMARY

Problems to be Resolved by the Invention

The present disclosure provides a plasma processing apparatus and a plasma processing method capable of producing plasma locally at an end part of a substrate and effectively performing plasma processing on the end part of the substrate.

Means of Solving the Problems

In accordance with a plasma processing apparatus according to one exemplary embodiment, the plasma processing apparatus for performing plasma processing on an end part of a substrate, comprising a processing container, a substrate supporting member configured to support a portion of the substrate at least excluding the end part to be subjected to the plasma processing in the processing container, a high frequency power being applied to the substrate supporting member and at least a side of the substrate supporting member being composed of a dielectric, an opposing dielectric member composed of a dielectric and disposed to oppose the substrate supporting member, a side ground electrode provided at a side of the substrate supported by the substrate supporting member so as to be close to the substrate to such an extent that an electrical coupling is formed between an end surface of the substrate and the side ground electrode, the side ground electrode having a ground potential, and a gas supply configured to supply a processing gas for generating plasma on at least the end part of the substrate.

Effect of the Invention

In accordance with the present disclosure, there are provided a plasma processing apparatus and a plasma processing method capable of producing plasma locally at an end part of a substrate and effectively performing plasma processing on the end part of the substrate.

DETAILED DESCRIPTION

Hereinafter, embodiments will be described with reference to the accompanying drawings.

First Embodiment

First, a first embodiment will be described.

Figure 1:
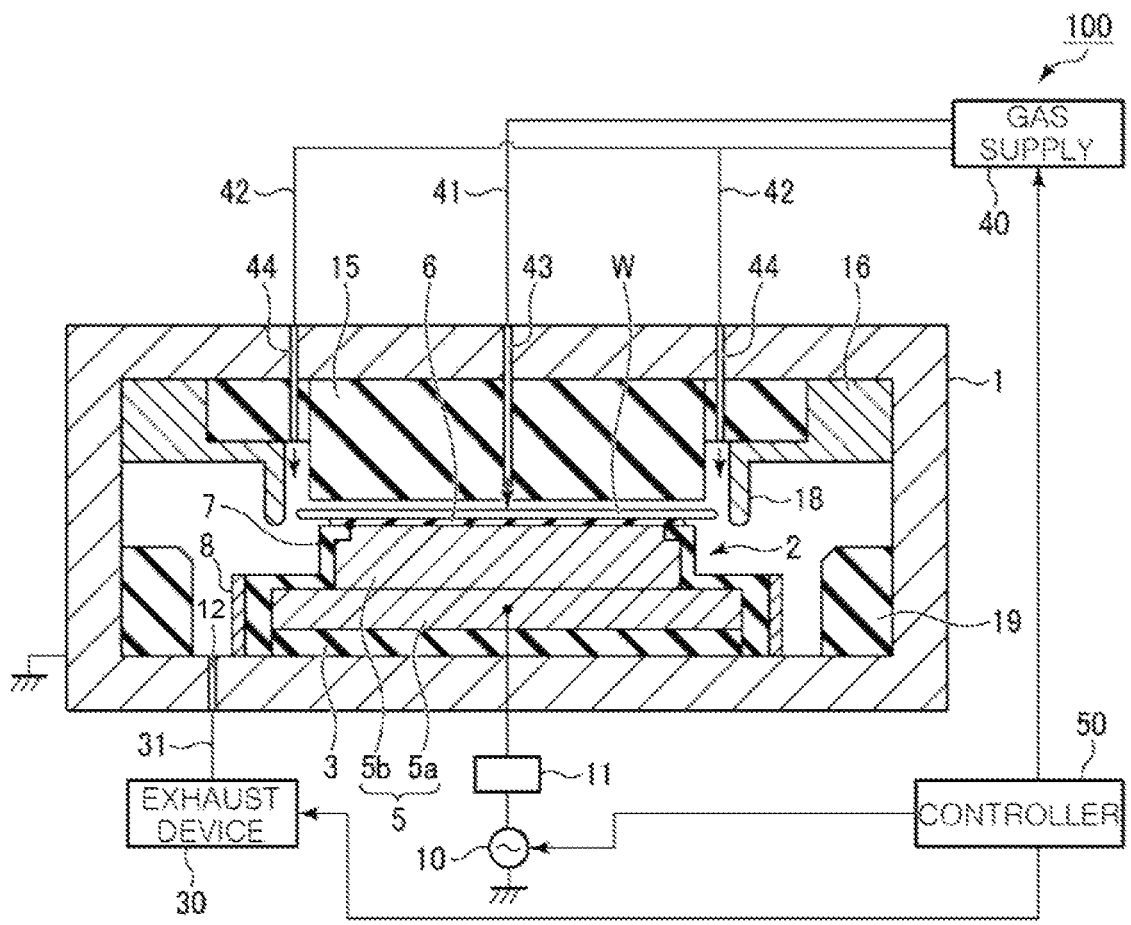
FIG. 1 is a cross-sectional view schematically showing a plasma processing apparatus according to a first embodiment.

FIG. 1 is a cross-sectional view schematically showing a plasma processing apparatus according to the first embodiment.

The plasma processing apparatus 100 is configured to perform plasma processing on an end part of a substrate such as a semiconductor wafer or the like. Specifically, deposits such as polymers and the like adhered to the end part of the substrate are removed by plasma etching. The plasma processing apparatus 100 includes a processing container 1, a substrate support 2, a high frequency power supply 10, an upper dielectric member 15, a side ground electrode 18, an exhaust device 30, a gas supply 40, and a controller 50.

The processing container 1 is made of a metal such as aluminum or the like, and accommodates therein the substrate support 2, the upper dielectric member 15, the side ground electrode 18, and the like. The processing container 1 is grounded.

The substrate support 2 places a substrate W thereon, and is configured as a substrate supporting member for supporting a portion of the substrate W at least excluding an end part to be subjected to plasma processing. The substrate support 2 is disposed at a bottom portion of the processing chamber 1 via a spacer 3 made of an insulator. The substrate support 2 has a base 5 made of a metal such as aluminum or the like, and an outer peripheral dielectric member 7 covering outer peripheries of the base 5 and the spacer 3. The base 5 can be separated into a lower member 5a having a large diameter and an upper member 5b having a small diameter, and the upper member 5b can be replaced. The outer portion of the outer peripheral dielectric member 7 corresponding to the lower member 5a and the spacer 3 is covered with a metal cover 8 extending from a bottom wall of the processing container 1. An electrostatic chuck 6 for electrostatically attracting the substrate W is disposed on the upper surface of the base 5. Lift pins (not shown) for transferring the substrate W are disposed in the substrate support 2 to protrude from and retract below the upper surface of the substrate support 2.

The base 5 of the substrate support 2 is not necessarily made of a metal, and may be made of a dielectric such as ceramic having a high frequency electrode therein. When the substrate support 2 is made of a dielectric, the outer peripheral dielectric member may be omitted. In other words, at least a side surface of the substrate support 2 is preferably made of a dielectric. Accordingly, it is possible to prevent an excessive electric field from leaking from the substrate support 2 to which a high frequency power is supplied.

The substrate W may be placed directly on the base 5 without providing the electrostatic chuck 6. Although it is illustrated in the drawing that the substrate support 2 is fixed to the processing container 1, it is preferable that the substrate support 2 is vertically movable in consideration of loading and unloading of the substrate W.

The high frequency power supply 10 is connected to the base 5 of the substrate support 2 through a matching device 11. Accordingly, a high frequency power is supplied to the base 5. When the base of the substrate support 2 is made of a dielectric such as ceramic or the like, an electrode may be disposed in the base, and a high frequency power may be supplied to the electrode.

The upper dielectric member 15 is disposed to face the substrate support in order to suppress the generation of plasma at the central portion of the substrate W, and serves as an opposing dielectric member. The upper dielectric member 15 is made of a dielectric such as alumina or the like, and is supported by a ceiling wall of the processing container 1. The upper dielectric member 15 is disposed above the substrate support 2 to be close to and face the substrate support 2. The distance between the substrate W placed on the substrate support 2 and the upper dielectric member 15 is preferably about 1 mm or less, more preferably 0.1 mm to 1 mm.

The side ground electrode 18 is disposed at a side (outer side) of the substrate W supported by the substrate support 2, and has a ring shape. The side ground electrode 18 extends from a metal ring member 16 disposed around the upper dielectric member 15 and supported by the ceiling wall of the processing container 1, and has a ground potential similarly to the processing container 1. The side ground electrode 18 functions as an opposing electrode of the substrate support 2 (the base 5) to which a high frequency power is applied, and is disposed at a position close to the substrate W to such an extent that an electrical coupling is formed between the end surface of the substrate W and the side ground electrode 18 with plasma interposed therebetween. The side ground electrode 18 will be described in detail later.

An exhaust port 12 is formed at the bottom wall of the processing container 1, and an exhaust device 30 having a vacuum pump, an automatic pressure control valve, or the like is connected to the exhaust port 12 through an exhaust line 31. The processing container 1 is evacuated and controlled to a predetermined vacuum pressure by the exhaust device 30.

The gas supply 40 supplies an etching gas such as $CF_4$ gas and an inert gas such as Ar gas to the substrate W. A first gas line 41 and a second gas line 42 extend from the gas supply 40. The first gas line 41 is connected to a first gas channel 43 disposed at the ceiling wall of the processing container 1 and the center of the upper dielectric member 15. Further, the second gas line 42 is connected to a plurality of second gas channels 44 arranged at the ceiling wall of the processing container 1 and the end part of the upper dielectric member 15. An inert gas is supplied from the gas supply 40 to the central portion of the substrate W through the first gas line 41 and the first gas channel 43, and an etching gas is supplied to the end part of the substrate W through the second gas line 42 and the second gas channels 44. Accordingly, the flow of the inert gas is formed from the center toward the end part of the substrate W, thereby preventing the etching gas from reaching the center of the substrate W.

The controller 50 is a computer including a CPU, a storage device, and the like, and controls components of the plasma processing apparatus 100, such as the high frequency power supply 10, the exhaust device 30, the gas supply 40, and the like. The controller 50 controls the components of the plasma processing apparatus 100 to perform predetermined operations based on a processing recipe stored in a storage medium of the storage device.

An insulating member 19 is disposed at the outer periphery of the inner bottom portion of the processing container 1 to surround the spacer 3 and the substrate support 2. A loading/unloading port (not shown) for loading and unloading the substrate W is disposed at a sidewall of the processing container 1, and the loading/unloading port can be opened and closed by a gate valve (not shown).

Next, the side ground electrode 18 will be described in detail.

Figure 2:
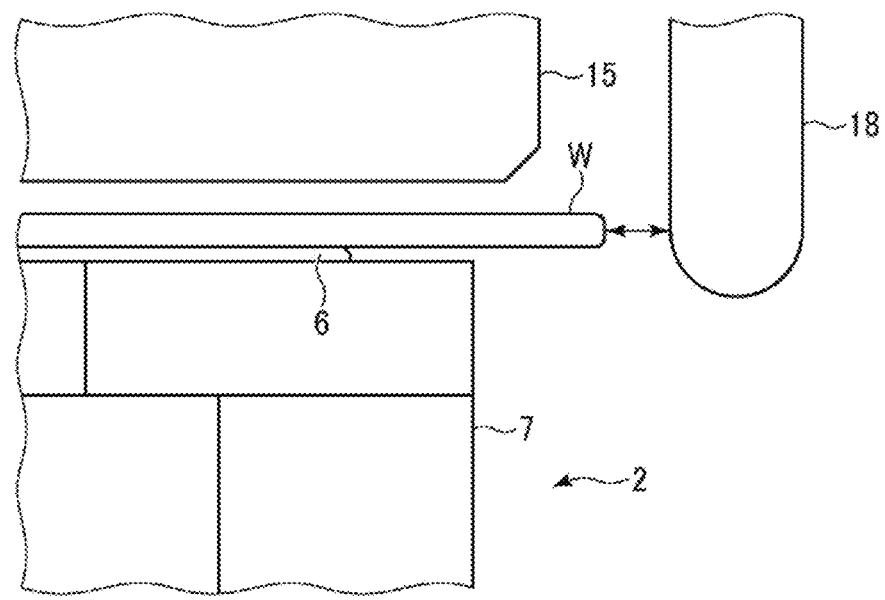
FIG. 2 is an enlarged cross-sectional view showing main parts of the plasma processing apparatus according to the first embodiment.
Figure 3:
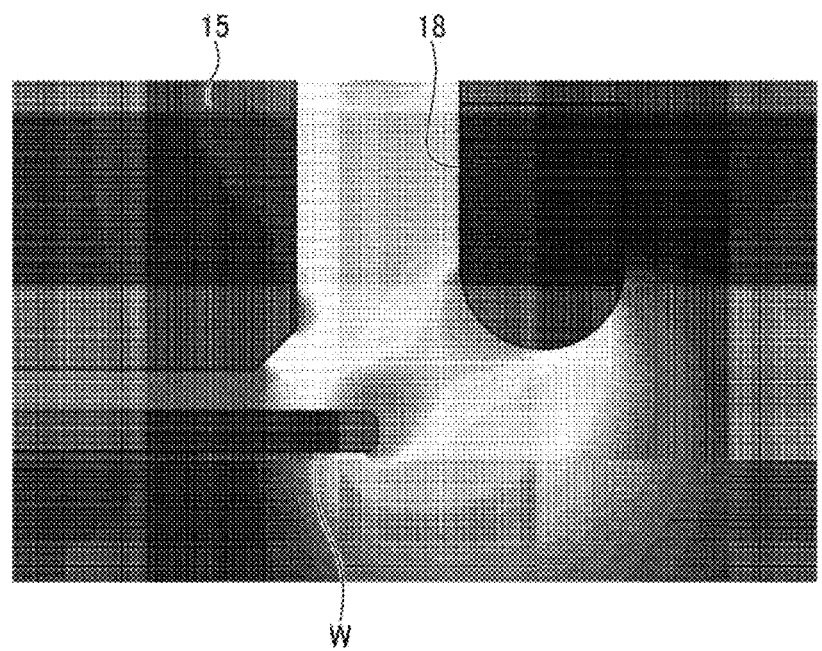
FIG. 3 shows electromagnetic field simulation results of a portion including an end part of a substrate and a side ground electrode in the plasma processing apparatus according to the first embodiment.

As described above, the side ground electrode 18 is disposed at a side (outer side) of the substrate W. The side ground electrode 18 functions as an opposing electrode of the substrate support 2 to which a high frequency power is supplied. As shown in FIG. 2, the side ground electrode 18 is disposed at a position close to the substrate W to such an extent that an electrical coupling is formed between the side ground electrode 18 and the end surface of the substrate W with plasma interposed therebetween, and has a function of concentrating an electric field between the side ground electrode 18 and the end surface of the substrate W. Accordingly, the electric field at the central portion of the substrate W can be suppressed, and the generation of excessive generation of plasma at the central portion of the substrate W can be suppressed. FIG. 3 shows electromagnetic field simulation results of a portion including the end part of the substrate W and the side ground electrode 18. From FIG. 3, it is clear that by providing the side ground electrode 18 at an appropriate position near the side (outer side) of the substrate W, an electrical coupling is formed between the side ground electrode 18 and the substrate W, and an electric field is concentrated particularly at the end surface of the substrate W.

Figure 4:
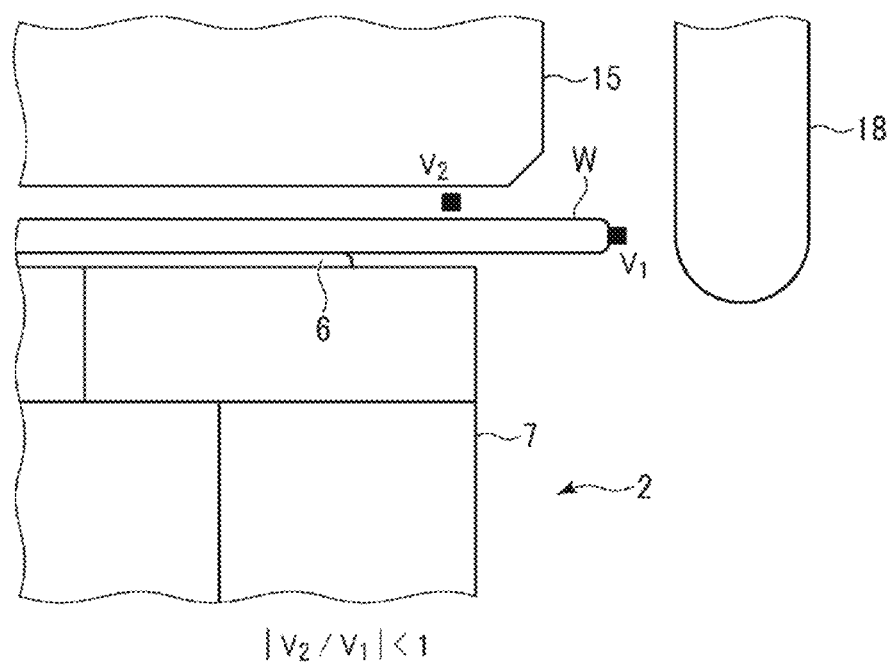
FIG. 4 explains electric field strengths V1 and V2.

In order to effectively exhibit such a function, as shown in FIG. 4, it is preferable that the side ground electrode 18 is disposed at a position at which a condition $|V2/V1|<1$ is satisfied when an electric field strength at an end part of the substrate W facing the side ground electrode 18 is set to V1, and a maximum electric field strength between the upper dielectric member 15 and the frontside surface of the substrate W is set to V2. Accordingly, the function of concentrating the electric field between the end surface of the substrate W and the side ground electrode 18 is exhibited more effectively, thereby enhancing the effect of suppressing the electric field at the central portion of the substrate W.

Such an effect increases as the value of $|V2/V1|$ decreases. It is preferable to satisfy a condition $|V2/V1| \leq 0.7$ and more preferably to satisfy a condition $|V2/V1| \leq 0.5$.

Figure 5:
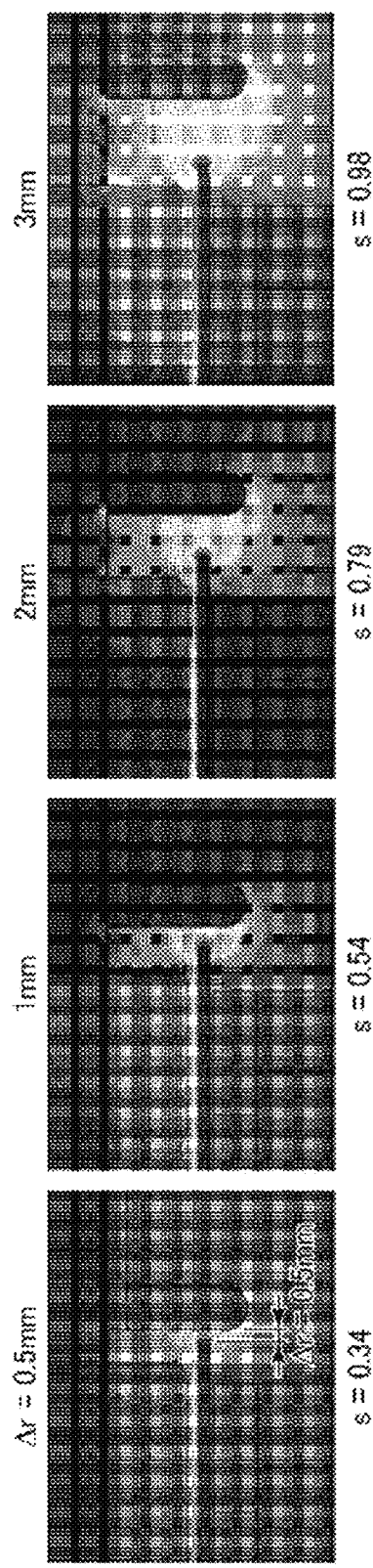
FIG. 5 shows the relationship between a horizontal distance $\Delta r$ which is a distance between an end surface of the substrate and the side ground electrode and $|V2/V1|=s$.

The value of $|V2/V1|$ is determined by the position of the side ground electrode 18. For example, the relationship between a horizontal distance $\Delta r$ which is a distance between the end surface of the substrate W and the side ground electrode 18 and $|V2/V1|$ is shown in the electromagnetic field simulation results of FIG. 5. In FIG. 5, "s" indicates a value of $|V2/V1|$, and the value of "s" decreases as the horizontal distance $\Delta r$ decreases.

Further, a distance $\Delta z$ between a height position of the center in the thickness direction of the substrate W and a height position of a tip end of the side ground electrode 18 also affects the value of $|V2/V1|$. For example, the distance $\Delta z$ is zero in the case where the height position of the tip end of the side ground electrode 18 is the same as the height position of the center in the thickness direction of the substrate W, and a downward direction is set to a positive direction and an upward direction is set to a negative direction. In this case, as the distance $\Delta z$ decreases from 0 in the negative direction, the side ground electrode 18 becomes distant from the substrate W, and the value of $|V2/V1|$ tends to increase.

Figure 6:
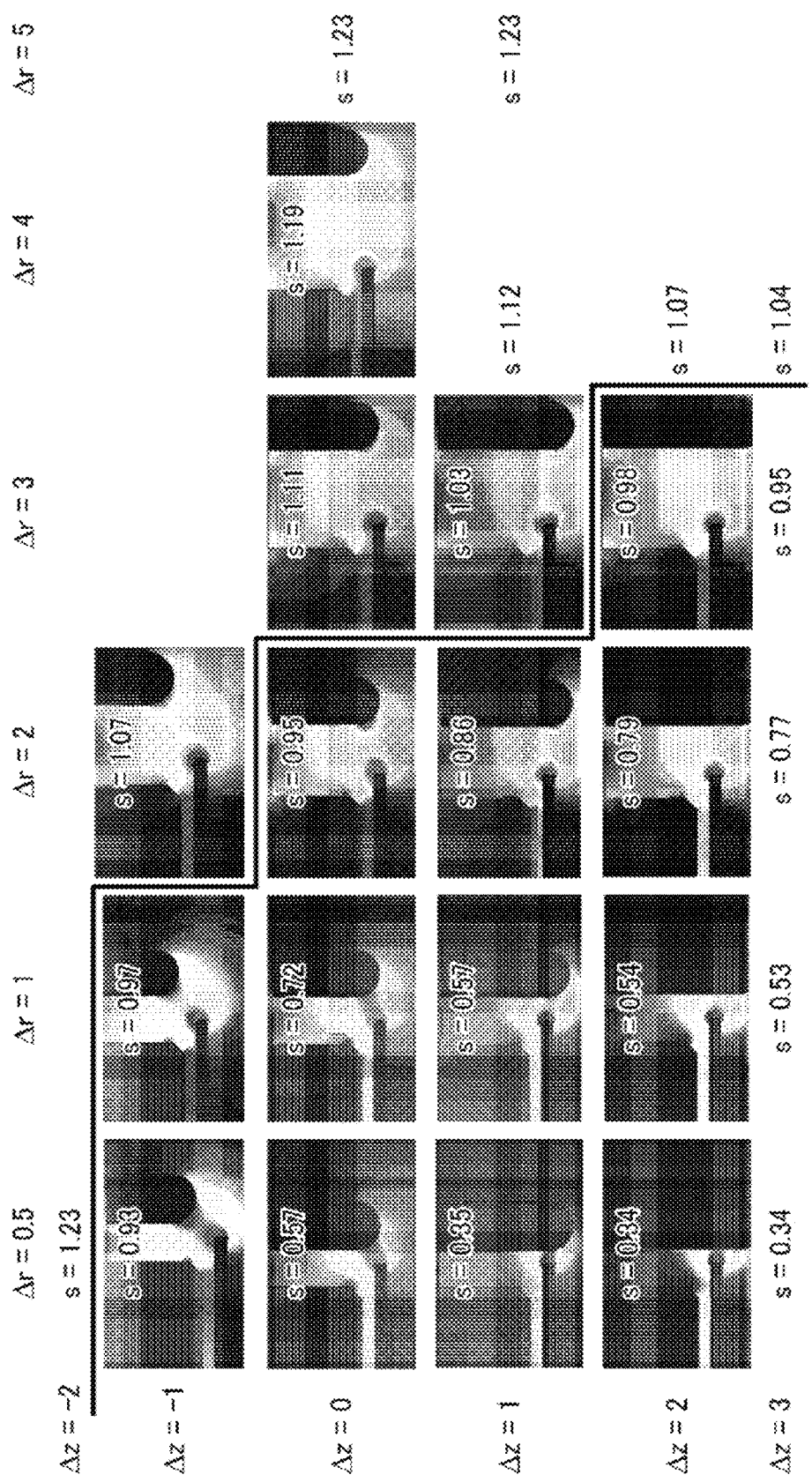
FIG. 6 shows electromagnetic field simulation results showing the relationship between the values of $\Delta r$ and $\Delta z$ and $|V2/V1|=s$.

FIG. 6 shows electromagnetic field simulation results showing the relationship between the values of $\Delta r$ and $\Delta z$ and $|V2/V1|=s$. As shown in FIG. 6, a condition $s<1$ can be satisfied when at least $\Delta r$ is 3 mm or less or at least $\Delta z$ is −1 mm or more. Further, a condition $s \leq 0.7$ can be satisfied when $\Delta r$ is 1 mm or less or $\Delta z$ is 0 mm or more, and a condition $s \leq 0.5$ can be satisfied when $\Delta r$ is 0.5 mm or less or $\Delta z$ is 1 mm or more.

In the plasma processing apparatus configured as described above, the substrate W is loaded into the processing container 1 through a loading/unloading port (not shown) and placed on the substrate support 2. A pressure in the processing container 1 is set to a predetermined vacuum level by the exhaust device 30, and an inert gas and an etching gas are supplied from the gas supply 40. At this time, the etching gas is supplied to the end part of the substrate W through the second gas line 42 and the second gas channels 44 while supplying the inert gas to the center of the substrate W through the first gas line 41 and the first gas channel 43.

Therefore, the flow of the inert gas is formed from the center toward the end part of the substrate W. Accordingly, the etching gas is prevented from reaching the center side of the substrate W, and is mainly supplied to the end part of the substrate W to be subjected to the plasma processing.

In this state, a high frequency power is supplied from the high frequency power supply 10 to the base 5 of the substrate support 2. Accordingly, the side ground electrode 18 mainly functions as an opposing electrode, and plasma is locally generated at the end part of the substrate W, so that only deposits such as polymers adhered to the end part of the substrate W are removed by etching.

At this time, the side ground electrode 18 is disposed at a position close to the substrate W to such an extent that an electrical coupling is formed between the side ground electrode 18 and the end surface of the substrate W, and has a function of concentrating an electric field between the side ground electrode 18 and the end surface of the substrate W. Accordingly, the excessive generation of plasma at the central portion of the substrate W can be suppressed by suppressing the electric field at the central portion of the substrate W. Hence, plasma can be generated locally only at the end part of the substrate W, and the end part of the substrate W can be etched effectively.

Particularly, the arrangement position of the side ground electrode 18 is adjusted to satisfy a condition $|V2/V1|<1$, more preferably a condition $|V2/V1| \leq 0.7$, and even more preferably a condition $|V2/V1| \leq 0.5$, so that the function of enhancing an electrical coupling with the substrate W and concentrating the electric field can be improved. Accordingly, the effect of suppressing the generation of excessive plasma at the central portion of the substrate W by suppressing the electric field at the central portion of the substrate W can be enhanced.

In the first embodiment, the side ground electrode 18 is disposed at the side (outer side) of the substrate W, which is particularly suitable for removal of deposits adhered to the beveled portion of the end surface of the substrate W.

In the above example, the side ground electrode 18 extends from the metal ring member 16 disposed around the upper dielectric member 15 and supported by the ceiling wall of the processing container 1. However, the present disclosure is not limited thereto, and the side ground electrode 18 may be connected anywhere as long as it has a ground potential.

Second Embodiment

Next, a second embodiment will be described.

Figure 7:
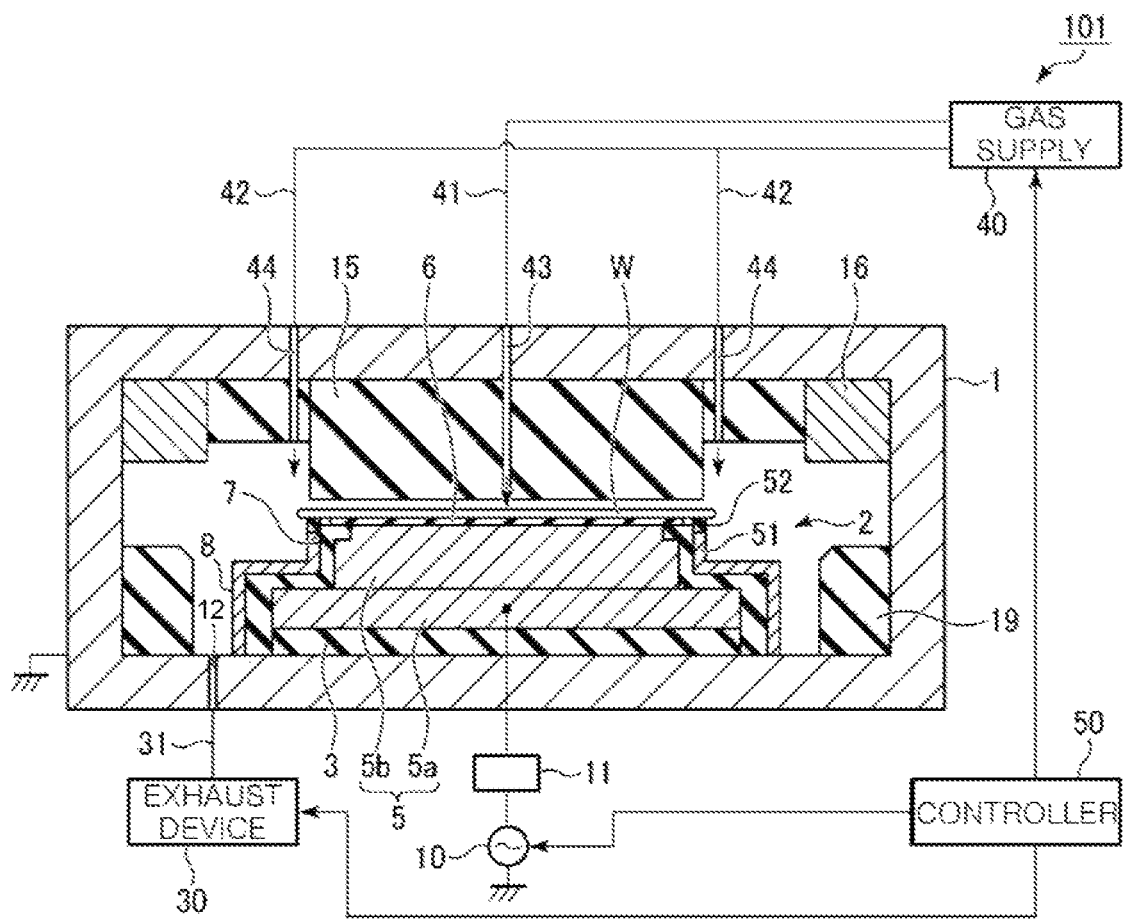
FIG. 7 is a cross-sectional view schematically showing a plasma processing apparatus according to a second embodiment.

FIG. 7 is a cross-sectional view schematically showing a plasma processing apparatus according to a second embodiment.

A basic configuration of a plasma processing apparatus 101 of the present embodiment is the same as that of the first embodiment shown in FIG. 1. However, the plasma processing apparatus 101 is different from the plasma processing apparatus 100 of FIG. 1 in that it includes a lower ground electrode 51 instead of the side ground electrode 18.

Figure 8:
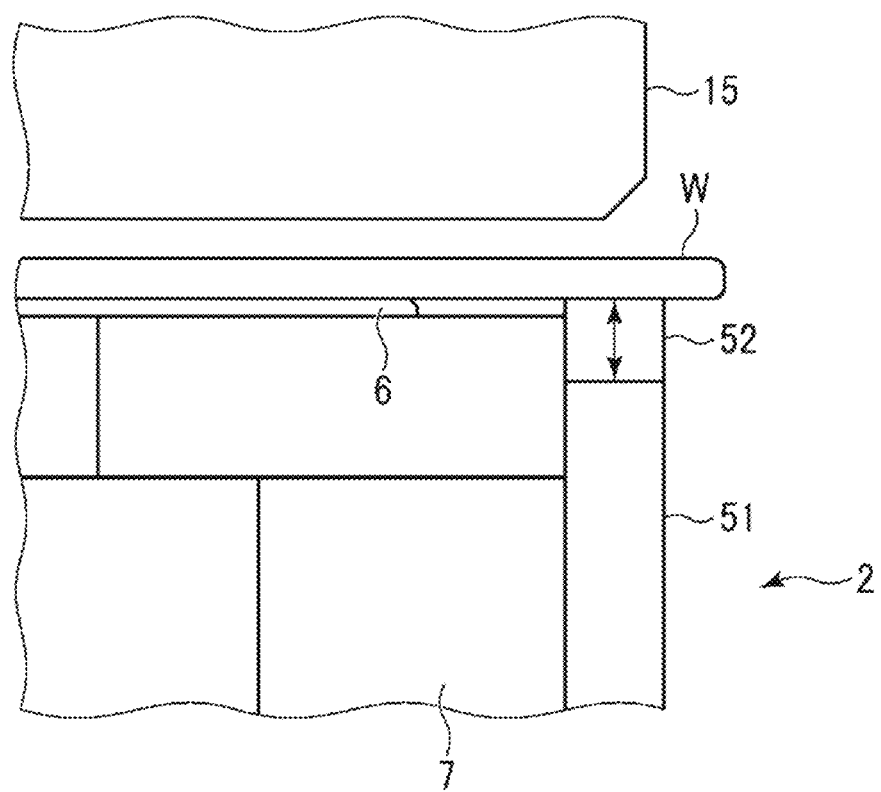
FIG. 8 is an enlarged cross-sectional view showing main parts of the plasma processing apparatus according to the second embodiment.

The lower ground electrode 51 extends from a metal cover 8 disposed to be in contact with the bottom wall of the processing container 1, and has a ring shape to surround the outer peripheral dielectric member 7. The lower ground electrode 51 is disposed to be close to a position directly below the end part of the backside surface of the substrate W, and is grounded through the cover 8 and the processing container 1. Further, the lower ground electrode 51 is disposed at a further outer peripheral side than the outer peripheral dielectric member 7 and is insulated from the base 5, and thus functions as an opposing electrode of the base 5 functioning as an electrode to which a high frequency power is applied. As shown in FIG. 8, the lower ground electrode 51 is disposed to a position close to the substrate W to such an extent that an electrical coupling is formed between the lower ground electrode 51 and the end part of the backside surface of the substrate W, and has a function of concentrating an electric field between the lower ground electrode 51 and the end part of the backside surface of the substrate W with a dielectric or a space interposed therebetween. Accordingly, the electric field at the central portion of the substrate W can be suppressed, and the excessive generation of plasma at the central portion of the substrate W can be suppressed. The distance between the lower ground electrode 51 and the backside surface of the substrate W is preferably 0.5 mm to 3 mm.

A ring-shaped dielectric member 52 made of alumina or the like is disposed between the lower ground electrode 51 and the substrate W. The ring-shaped dielectric member 52 can suppress plasma from reaching the backside surface of the substrate W. In this example, the ring-shaped dielectric member 52 is provided as an independent member. However, the ring-shaped dielectric member 52 may be a part of the electrostatic chuck 6 or a part of the outer peripheral dielectric member 7, which are also included in the form of the ring-shaped dielectric member 52.

In the present embodiment, the lower ground electrode 51 is positioned directly below the end part of the backside surface of the substrate W and is provided at a position close to the substrate W to such an extent that an electrical coupling is formed between the lower ground electrode 51 and the end part of the backside surface of the substrate W, and has a function of concentrating an electric field between the lower ground electrode 51 and the end part of the backside surface of the substrate W. Therefore, the excessive generation of plasma at the central portion of the substrate W can be suppressed. Further, by providing the ring-shaped dielectric member 52 made of alumina or the like between the lower ground electrode 51 and the substrate W, plasma can be prevented from reaching the backside surface of the substrate W. Accordingly, plasma can be concentrated at the end part of the substrate W.

In the second embodiment, the lower ground electrode 51 is disposed to be close to the position directly below the end part of the backside surface of the substrate W, which is particularly suitable for removal of deposits adhered to the end part of the backside surface of the substrate W.

In the above example, the lower ground electrode 51 extends upward along the upper portion of the outer peripheral dielectric member 7 from the metal cover 8 disposed to be in contact with the bottom wall of the processing container 1. However, the present disclosure is not limited thereto, and the lower ground electrode 51 may be connected anywhere as long as it has a ground potential.

Third Embodiment

Next, a third embodiment will be described.

Figure 9:
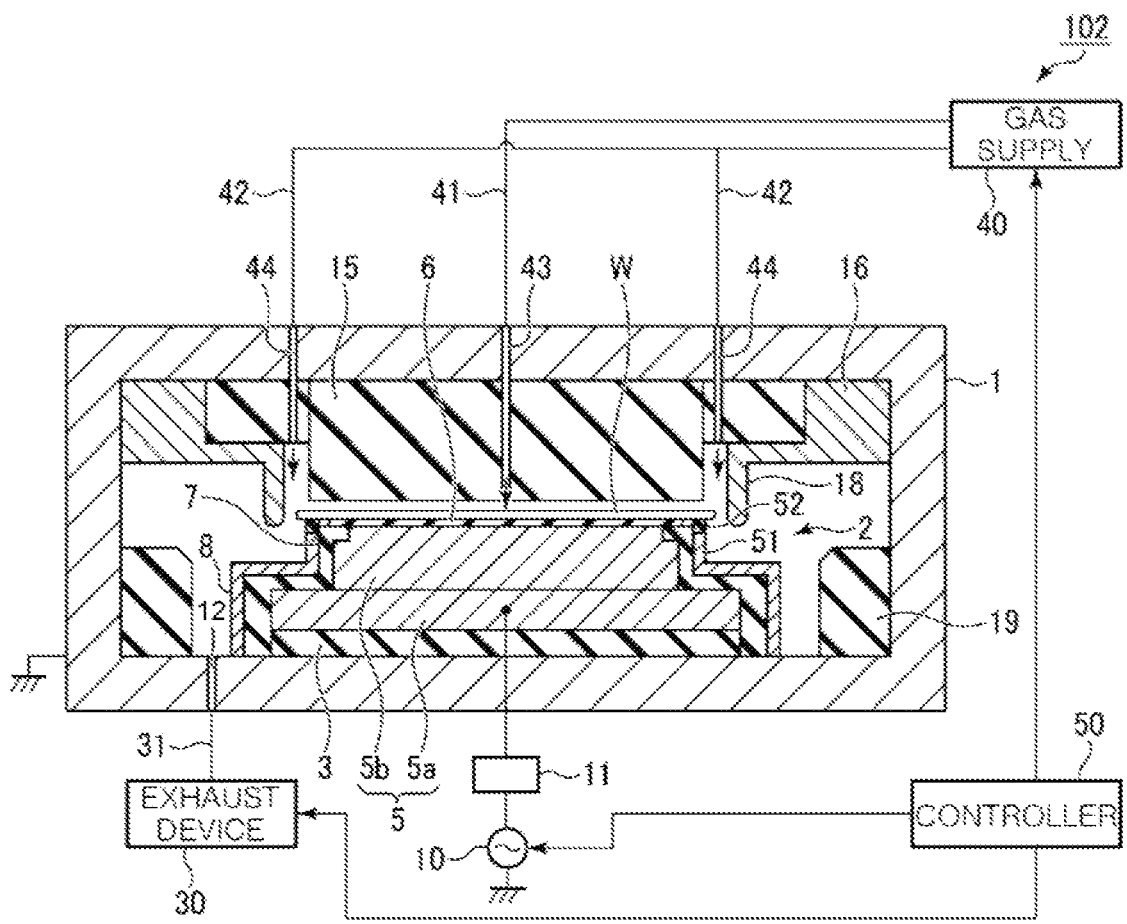
FIG. 9 is a cross-sectional view schematically showing a plasma processing apparatus according to a third embodiment.

FIG. 9 is a cross-sectional view schematically showing a plasma processing apparatus according to the third embodiment.

A basic configuration of the plasma processing apparatus 102 of the present embodiment is the same as that of the plasma processing apparatus 100 shown in FIG. 1. However, the plasma processing apparatus 102 is different from the plasma processing apparatus 100 of FIG. 1 in that it includes both the side ground electrode 18 and the lower ground electrode 51.

Figure 10:
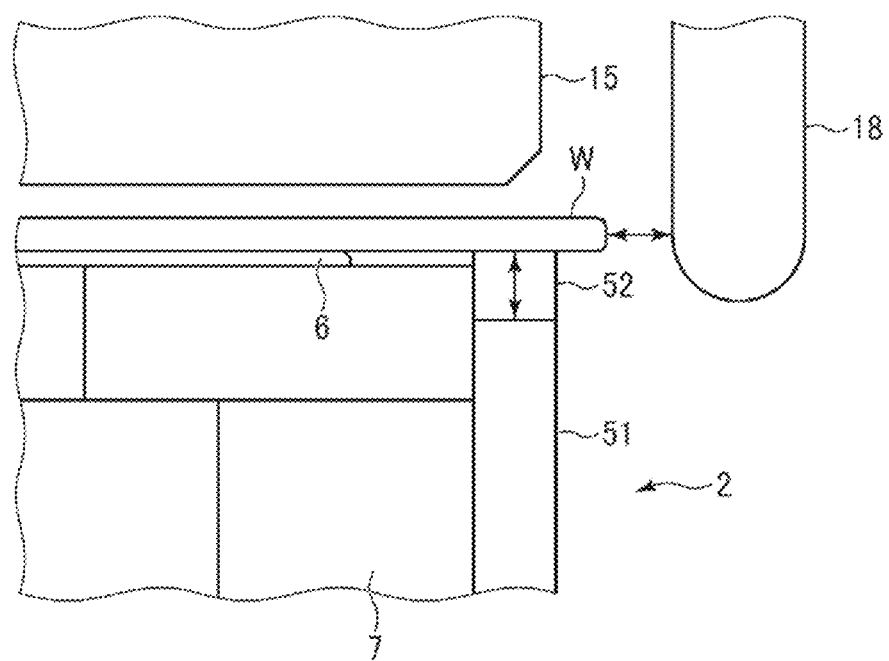
FIG. 10 is an enlarged cross-sectional view showing main parts of the plasma processing apparatus according to the third embodiment.

Since both the side ground electrode 18 and the lower ground electrode 51 are provided, they function as opposing electrodes of the base 5 serving as an electrode to which a high frequency power is applied. As shown in FIG. 10, the side ground electrode 18 and the lower ground electrode 51 are disposed to be close to the substrate W to such an extent that an electrical coupling is formed between the side ground electrode 18 and the end surface of the substrate W and between the lower ground electrode 51 and the end part of the backside surface of the substrate W. Further, the side ground electrode 18 and the lower ground electrode 51 have a function of concentrating an electric field between the side ground electrode 18 and the end surface of the substrate and between the lower ground electrode 51 and the end part of the backside surface of the substrate. Accordingly, the effect of suppressing excessive generation of plasma at the central portion of the substrate W by suppressing an electric field at the central portion of the substrate W can be improved compared to the case of providing one of the side ground electrode 18 and the lower ground electrode 51. In addition, plasma can be generated locally in the vicinity of the surface of the substrate W facing the side ground electrode 18 and the surface of the substrate W facing the lower ground electrode 51, so that it is possible to effectively remove deposits adhered to the end surface (beveled portion) of the substrate W and the end part of the backside surface of the substrate W.

The side ground electrode 18 and the lower ground electrode 51 may be connected anywhere as long as they have a ground potential.

<Other Applications>

While the embodiments have been described, the embodiments of the present disclosure are illustrative in all respects and are not restrictive. The above-described embodiments may be omitted, replaced, or changed in various forms without departing from the scope of the appended claims and the gist thereof.

For example, in the above embodiments, a high frequency power is applied to the substrate support to generate plasma at the end part of the substrate. However, the present disclosure is not limited thereto. Further, in the above embodiments, an example in which the end part of the substrate is subjected to plasma etching has been described. However, another plasma processing may be performed. Furthermore, in the above embodiments, a semiconductor wafer is used as an example of a substrate. However, the substrate is not limited thereto, and may be another substrate such as a flat panel display (FPD) substrate, a ceramic substrate, or the like.

DESCRIPTION OF REFERENCE NUMERALS

1: processing container
2: substrate support
5: base
6: electrostatic chuck
7: outer peripheral dielectric member
10: high frequency power
51: lower ground electrode
52: ring-shaped dielectric member
100, 101, 102: plasma processing apparatus
W: substrate

The invention claimed is:

1. A plasma processing apparatus for performing plasma processing on an end part of a substrate, comprising:
   a processing container;
   a substrate supporting member configured to support a portion of the substrate at least excluding the end part to be subjected to the plasma processing and to which a high frequency power is applied in the processing container, at least a side of the substrate supporting member being composed of a dielectric;
   an opposing dielectric member composed of a dielectric and disposed to oppose the substrate supporting member;
   a side ground electrode provided on at a side of the substrate supported by the substrate supporting member so as to be close to the substrate to such an extent that an electrical coupling is formed between an end surface of the substrate and the side ground electrode, the side ground electrode having a ground potential; and
   a gas supply configured to supply a processing gas for generating plasma on at least the end part of the substrate,
   wherein when an electric field strength at the end part of the substrate facing the side ground electrode is set to V1, and a maximum electric field strength between the opposing dielectric member and a frontside surface of the substrate is set to V2, the side ground electrode is disposed at a position at which a condition $|V2/V1|<1$ is satisfied.

2. The plasma processing apparatus of claim 1, wherein a horizontal distance Δr between the end surface of the substrate and the side ground electrode is 3 mm or less.

3. The plasma processing apparatus of claim 1, wherein when a height position of a center in a thickness direction of the substrate and a height position of a tip end of the side ground electrode are the same, a distance Δz is set to zero, and the distance Δz in the height direction is-1 mm or more in the case where a downward direction is set to a positive direction and an upward direction is set to a negative direction.

4. The plasma processing apparatus of claim 1, wherein the side ground electrode is disposed at a position at which a condition $|V2/V1|<0.7$ is satisfied.

5. The plasma processing apparatus of claim 4, wherein the side ground electrode is disposed at a position at which a condition $|V2/V1|<0.5$ is satisfied.

6. The plasma processing apparatus of claim 1, further comprising:

a lower ground electrode formed in a ring shape to surround the substrate supporting member, positioned below an end part of a backside surface of the substrate to be close to the substrate to such an extent that an electrical coupling is formed between the lower ground electrode and the end part of the backside surface of the substrate, and the lower ground electrode having a ground potential.

7. The plasma processing apparatus of claim 6, further comprising:

a ring-shaped dielectric member interposed between the lower ground electrode and the backside surface of the substrate.

8. A plasma processing method using the plasma processing apparatus described in claim 1, comprising:

supporting the substrate on the substrate supporting member;

supplying the processing gas for generating plasma at least to the end part of the substrate; and supplying the high frequency power to the substrate supporting member to perform plasma processing on the end part of the substrate.

* * * * *